United States Patent [19]

Cosentino et al.

[11] Patent Number: 5,615,094
[45] Date of Patent: Mar. 25, 1997

[54] NON-DISSIPATIVE SNUBBER CIRCUIT FOR A SWITCHED MODE POWER SUPPLY

[75] Inventors: Anthony P. Cosentino, Bartlett; Keith Wetterquist, McHenry, both of Ill.

[73] Assignee: Power Conversion Products, Inc., Crystal Lake, Ill.

[21] Appl. No.: 450,161

[22] Filed: May 26, 1995

[51] Int. Cl.$^6$ ............................................. H02H 7/122
[52] U.S. Cl. ..................................... 363/56; 361/91
[58] Field of Search ................... 362/24, 25, 26, 362/50, 56, 124, 134; 361/56, 58, 91, 111; 323/289

[56] References Cited

U.S. PATENT DOCUMENTS

| | | | |
|---|---|---|---|
| 4,403,269 | 9/1983 | Carroll | 361/91 |
| 4,489,373 | 12/1984 | du Parc | 363/56 |
| 4,566,059 | 1/1986 | Gallios et al. | 363/17 |
| 4,607,322 | 8/1986 | Henderson | 363/56 |
| 4,626,980 | 12/1986 | McGuire | 363/56 |
| 4,745,513 | 5/1988 | McMurray | 361/56 |
| 4,760,324 | 7/1988 | Underhill | 323/282 |
| 4,772,810 | 9/1988 | Felps | 307/253 |
| 4,802,078 | 1/1989 | Hill | 363/56 |
| 4,870,554 | 9/1989 | Smith | 363/20 |
| 4,937,725 | 6/1990 | Dhyanchand et al. | 363/56 |
| 5,014,180 | 5/1991 | Nuechterlein | 363/56 |
| 5,055,991 | 10/1991 | Carroll et al. | 363/56 |
| 5,258,902 | 11/1993 | Lindbery et al. | 363/56 |
| 5,260,607 | 11/1993 | Kinbara | 307/253 |
| 5,278,748 | 1/1994 | Kitajima | 363/56 |
| 5,461,556 | 10/1995 | Horie et al. | 363/58 |

FOREIGN PATENT DOCUMENTS 0130771   8/1983   Japan ......................... 363/56

OTHER PUBLICATIONS

IBM Technical Disclosure Bulletin, vol. 27, No. 2 Jul. 1984, Snubber circuit for PWM full-gridge converter switching regulator, Hitchcock et al.

*Primary Examiner*—Peter S. Wong
*Assistant Examiner*—Adolf Berhane
*Attorney, Agent, or Firm*—Brinks Hofer Gilson & Lione

[57] ABSTRACT

A non-dissipative snubber circuit for a switched mode power supply in which the excess energy generated by the parasitic voltage spike of a freewheeling diode turning off is directed to either the output of the power supply or to ground. A snubber capacitor stores the excess energy and a snubber circuit path is established during on pulses received by the secondary to allow the excess energy stored in snubber capacitor to be directed to the output of the power supply. Alternatively, the snubber circuit path may direct that excess energy to ground.

13 Claims, 5 Drawing Sheets

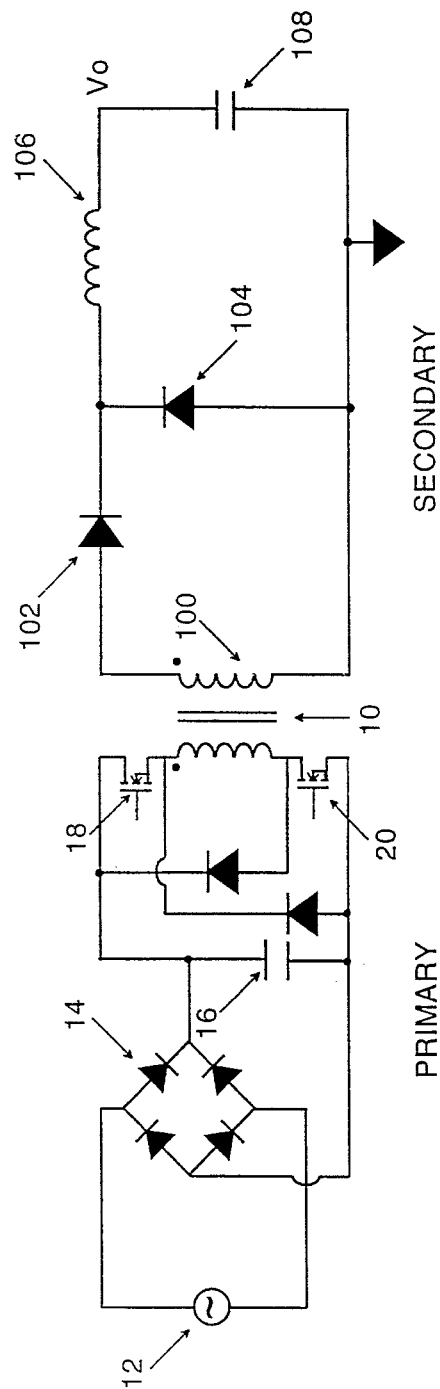
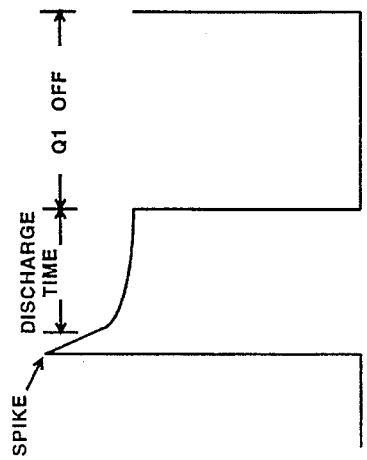
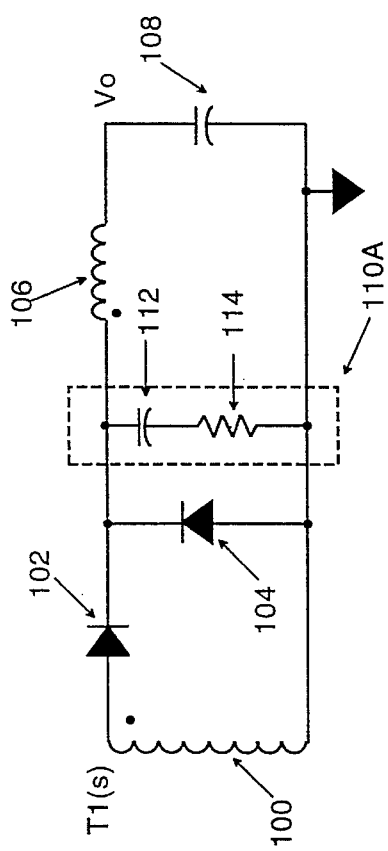
FIGURE 1 PRIOR ART
FIGURE 2A
FIGURE 2 PRIOR ART

NON-DISSIPATIVE SNUBBER CIRCUIT FOR A SWITCHED MODE POWER SUPPLY

BACKGROUND OF THE INVENTION

The present invention relates to snubber circuits. In particular, the present invention relates to a non-dissipative snubber circuit for a switched mode power supply.

Snubber circuits are used in various power circuits to attenuate the magnitude of parasitic voltage spikes that develop in these supplies. FIG. 1 is a schematic of a conventional switched mode power supply having a two transistor forward topology. Switched mode power supplies are utilized to convert alternating voltage (a.c.) to direct voltage (d.c.) for various types of loads such as computers and telecommunication equipment. A transformer 10 is used to provide this isolation. On the primary side, an alternating voltage source 12 is converted to a direct voltage signal by rectifying bridge 14 and input capacitor 16. Transistors 18 and 20 are cycled on and off with a variable duty cycle which converts the dc voltage provided by the input capacitor to an ac voltage which the transformer 10 can use. The secondary winding 100 of the transformer 10 provides both isolation from the primary and the ability to select the voltage level on the secondary by the turns ratio of the secondary winding 100. The output voltage $V_o$ is regulated by changing the duty cycle of the transistors 18 and 20. A control circuit (not shown) senses the output voltage and controls the on time of transistors 18 and 20 to keep output voltage $V_o$ at a fixed level independent of any input line and output load variation as is well known to those of ordinary skill in the art.

The components of the secondary circuit will now be described followed by a description of the operation of the circuit. The secondary of this switched mode power supply includes a secondary winding 100, a first diode 102, a second diode 104, an output inductor 106 and an output capacitor 108. The first diode 102 is preferably referred to as a rectifying diode and the second diode 104 is preferably referred to as a freewheeling diode. The secondary winding 100 preferably has one end connected to ground and the other end connected to the anode of the rectifying diode 102. The freewheeling diode 104 is connected in parallel with the secondary winding 100 and rectifying diode 102. The output inductor 106 and output capacitor 108 are connected in series across the freewheeling diode 104 as shown. The output of the power supply is taken across the output capacitor 108.

The operation of the secondary of the power circuit will now be described. The primary side of the transformer transmits a square wave pulse train of on and off pulses to the secondary side of the transformer. The secondary winding 100 receives the pulse train of on and off pulses, and, during an on pulse, a voltage V is developed across the secondary winding 100. When an on pulse is received by the secondary winding 100, rectifying diode 102 is forward biased and freewheeling diode 104 is reversed biased. Current flows from the secondary winding 100 through rectifying diode 102 to the output inductor 106 and output capacitor 108 to charge inductor 106 and capacitor 108 and deliver power to the load (not shown) which is connected across capacitor 108. When an off pulse occurs, the voltage on the secondary winding 100 collapses (i.e. goes to zero), rectifying diode 102 becomes reversed biased and freewheeling diode 104 becomes forward biased. A current path is thus established between output inductor 106 and capacitor 108 and freewheeling diode 104. Thus during the off pulse cycle, energy stored in the inductor 106 and capacitor 108 is supplied to the load.

A problem arises, however, each time the secondary winding 100 of the power transformer receives an on pulse. In particular, when the next on pulse is received by the secondary winding 100, rectifying diode 102 is forward biased and freewheeling diode 104 is reversed biased. When freewheeling diode 104 is reversed biased, it tries to turn off, however, the charge stored in the P-N junction of the diode 104 must be swept out before the diode 104 can turn off. Without a snubber circuit in place, the freewheeling diode 104 can generate a large, fast voltage spike, often referred to as a parasitic voltage spike, as it tries to turn off. If the voltage spike is too large, the diode will fail due to an over-voltage condition. If the voltage spike is too fast, electrical noise is generated which can cause excess electromagnetic interference (EMI).

FIG. 2 is a schematic of the secondary of a switched mode power supply including a snubber circuit 110A according to the prior art. The snubber circuit 110A includes a capacitor 112 and a resistor 114 connected in series across the freewheeling diode 104. During the on pulse cycle, the capacitor 112 of the snubber circuit 110A also charges up to a voltage about equal to the voltage across secondary winding 100. During the off pulse cycle the energy stored in the capacitor 112 of the snubber circuit 110A dissipates through resistor 114. The snubber circuit 110A helps control the size of the spike caused by the freewheeling diode 104 turning off by providing a path for the charge developed across the P-N junction of the freewheeling diode 104 to flow into. Thus the capacitor 112 stores the energy of the spike generated by the freewheeling diode. During the next off pulse this energy is also dissipated in resistor 114.

FIG. 2A illustrates a typical waveform seen across freewheeling diode 104 as it tries to turn off. Depending upon the size of the diode and the environment in which the power circuit is placed, the amount of energy generated by the turn-off of the freewheeling diode 104 can be significant. The duration of the spike is very small compared to the duration of the entire on pulse. The total power lost in this circuit consists of two components. The first is the power generated by the charging and discharging of snubber capacitor 112. The first component may be defined by the equation $\frac{1}{2} CV^2 f$, where V is the secondary voltage generated by secondary winding 100, f is the frequency of the AC signal transmitted by the primary winding and C is the capacitance of capacitor 112. The second component is the power generated by the voltage spike which is caused by the freewheeling diode turning off.

It is thus desirable to utilize the excess energy generated by the freewheeling diode 104 turning off instead of dissipating it in a lossy component such as resistor 114. In particular, it is preferable to design a snubber circuit that allows the excess energy developed from the freewheeling diode turning off to be directed to the output (i.e., load) or back to the input.

Accordingly, it is an object of the present invention to provide a snubber circuit with favorable characteristics.

SUMMARY OF THE INVENTION

According to a first aspect of the invention, there is provided a snubber circuit for snubbing a freewheeling diode in a secondary portion of a switched mode power circuit. The secondary portion includes a secondary winding having a positive terminal and a grounded negative terminal, wherein the secondary winding receives a series of on and off pulses; a rectifying diode having its anode connected to the positive terminal of the secondary winding; the freewheeling diode having its anode grounded and its cathode connected to the cathode of the rectifying diode, an output inductor and output capacitor connected in series across the freewheeling diode wherein the output is taken across the output capacitor. The snubber circuit includes a snubber capacitor having a first terminal connected to ground and a second terminal a first diode having an anode coupled to the cathodes of the rectifying and freewheeling diodes, and a cathode coupled to the second terminal of the snubber capacitor, the first diode allowing the snubber capacitor during an on pulse to acquire sufficient charge from the secondary winding such that the voltage across the snubber capacitor is approximately equal to the voltage across the secondary winding; a second diode having an anode coupled to the cathode of the first diode and the second terminal of the snubber capacitor; a transistor having a drain, a gate and a source, the drain being coupled to the cathode of the second diode; and a second winding having a first terminal coupled to the output of the switched mode power circuit, a second terminal coupled to the gate of the transistor and a tap coupled to the source of the transistor.

According to another aspect of the invention, there is provided a snubber circuit for snubbing a freewheeling diode in a secondary portion of a switched mode power circuit. The secondary portion includes a secondary winding having a positive terminal and a grounded negative terminal, wherein the secondary winding receives a series of on and off pulses; a rectifying diode having its anode connected to the positive terminal of the secondary winding; the freewheeling diode having its anode grounded and its cathode connected to the cathode of the rectifying diode, an output inductor and output capacitor connected in series across the freewheeling diode wherein the output is taken across the output capacitor. The snubber circuit includes a snubber capacitor having a first terminal connected to ground and a second terminal; a first diode having an anode coupled to the cathodes of the rectifying and freewheeling diodes, and a cathode coupled to the second terminal of the snubber capacitor, the first diode allowing the snubber capacitor during an on pulse to acquire sufficient charge from the secondary winding such that the voltage across the snubber capacitor is approximately equal to the voltage across the secondary winding; a second diode having an anode coupled to the cathode of the first diode and the second terminal of the snubber capacitor; a transistor having a drain, a gate and a source, the drain being coupled to the cathode of the second diode; and a second winding having a first terminal grounded, a second terminal coupled to the gate of the transistor and a tap coupled to the source of the transistor.

According to still another aspect of the invention, there is provided a method for snubbing a voltage spike generated by a freewheeling diode of a secondary of a switched mode power supply, the switched power supply receiving a train of on and off pulses from a primary side of the switch power supply. The method includes the steps of coupling a snubber capacitor to the freewheeling diode during an on pulse to store the energy generated by the voltage spike of the freewheeling diode as it becomes reversed biased; and coupling the snubber capacitor to an output of the switched mode power supply during an on pulse to direct the energy stored in the snubber capacitor to ground during the on pulse.

The invention itself, together with further objects and attendant advantages, will best be understood by reference to the following detailed description, taken in conjunction with the accompanying drawings.

BRIEF DESCRIPTION OF THE DRAWINGS

FIG. 1 is a schematic of a conventional switched mode power supply two transistor forward topology.

FIG. 2 is a schematic of the secondary of a switched mode power supply including a snubber circuit according to the prior art.

FIG. 2A illustrates a typical waveform seen across freewheeling diode 104 as it tries to turn off.

DETAILED DESCRIPTION OF THE PRESENTLY PREFERRED EMBODIMENTS

Figure 3:
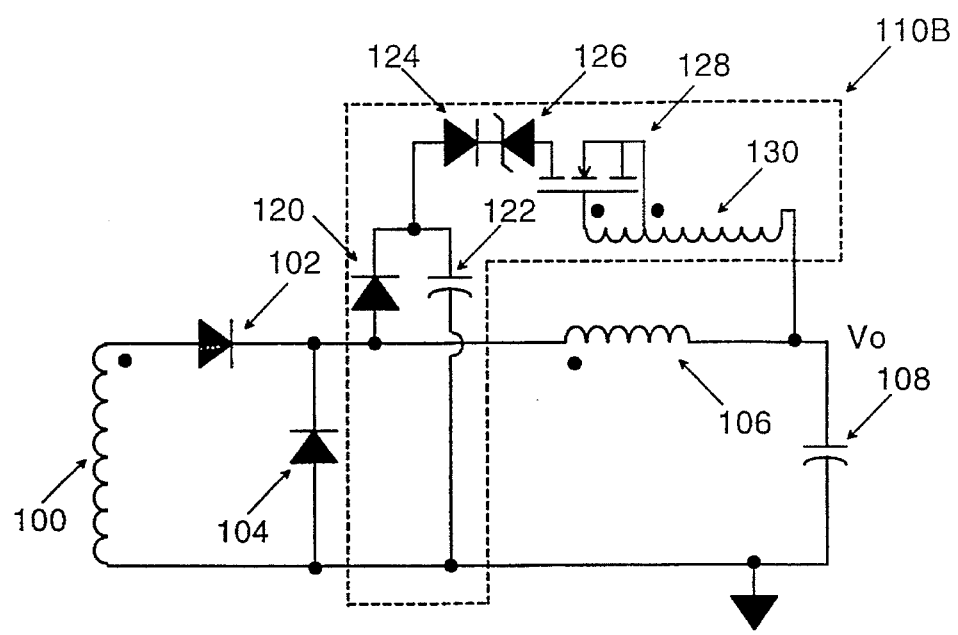
FIG. 3 is a schematic of the secondary portion of a switched mode power supply according to a first preferred embodiment of the present invention.

FIG. 3 is a schematic of the secondary portion of a switched mode power supply according to a first preferred embodiment of the present invention. The secondary portion has many of the same components arranged in the same configuration as the secondary portion described with reference to FIG. 2. Thus the same reference numerals used in FIG. 2 have been used to describe like components. In this preferred embodiment, the energy from the parasitic voltage spike is sent to the output of the power supply as will be described in greater detail hereinafter. The secondary winding 100, rectifying diode 102, freewheeling diode 104, and the output inductor 106 and output capacitor 108 are all connected in the same way as already described with reference to FIG. 2 and thus need not be described again. The snubber circuit 110B according to this preferred embodiment, includes a first diode 120, a capacitor 122, a second diode 124, a third diode 126, a transistor 128 and a second winding 130. Preferably the second winding 130 is taken from the secondary winding 100. The components of the snubber circuit are connected as shown and thus need not be further described.

The operation of the snubber circuit 110 in the secondary portion of the power circuit will now be described. As previously discussed, when the secondary winding 100 receives an on pulse, freewheeling diode 104 is reversed biased and rectifying diode 102 and first diode 120 of the snubber circuit are forward biased. The voltage from output $V_o$ to the tap of the second winding 130 is equal to or a little greater than the voltage across output inductor 106 and the voltage from the tap of the second winding 130 to the gate of transistor 128 turns transistor 128 on when rectifying diode 102 is forward biased. Thus, a current path exists through rectifying diode 102, first diode 120, second diode 124, third diode 126, transistor 128 and second winding 130 to the output. This current path allows the energy stored in snubber capacitor 122 due to the parasitic voltage spike generated by freewheeling diode 104 to be directed to the output as will be explained in greater detail.

When the secondary winding 100 receives an off pulse, rectifying diode 102 becomes reversed biased and freewheeling diode 104 becomes forward biased. A current path thus exists through freewheeling diode 104, output inductor 106 and output capacitor 108.

When the secondary 100 receives the next on pulse, rectifying diode 102 is forward biased and freewheeling diode is reversed biased. Transistor 128 is also turned on thereby creating a flow path through the snubber circuit i.e., through second diode 124, third diode 126, transistor 128 and second winding 130. When freewheeling diode 104 becomes reversed biased it tries to turn off. As diode 104 tries to turn off, however, a large voltage spike is generated as seen in FIG. 2A. The voltage spike is greater in magnitude than the voltage of the on pulse received by the secondary winding 100. During an on pulse, capacitor 122 is charged to a voltage approximately equal to the voltage across the secondary winding 100. The voltage spike created by freewheeling diode 104 causes diode 120 to become forward biased which allows that excess energy to be stored in capacitor 122. As previously discussed, the duration of the parasitic voltage spike is very small in comparison to the duration of the on pulse. Also, it takes a longer period of time than the duration of the voltage spike to turn on transistor 128 and establish a current path through the snubber circuit. Thus, as the on pulse is received the voltage spike is first stored in capacitor 122 then the flow path through the snubber circuit is established to allow the excess energy stored in capacitor to be discharged to the output of the power supply.

The capacitor 122 discharges down to a level approximately equal to the amplitude of the on pulse received by the secondary winding 100 but remains at a level high enough to prevent load current from flowing through this path. The third diode 126 which is preferably a zener diode provides an added level of protection to prevent load current from being sent through the snubber circuit 110B instead of flowing through output inductor 106. The first and second diodes 120 and 124 prevent current from flowing from the load back through the snubber circuit 110B to the secondary winding 100. At the termination of the on pulse from secondary winding 100, the polarity across winding 130 reverses turning transistor 128 off which prevents capacitor 122 from discharging. Thus, all of the excess energy generated by the voltage spike is diverted to the output of the power supply $V_o$ instead of being dissipated in a lossy component. Also, the voltage across capacitor 122 never discharges below the voltage generated by the secondary winding 100 because the energy generated by $\frac{1}{2}CV^2f$ is stored in the capacitor 122 and is not dissipated.

Also, because variations may occur in the input or output voltage levels depending upon the environment in which the power circuit is placed, the voltage across winding 130 should match the voltage across output inductor 106 when the input voltage to the supply is at its maximum and the output voltage of the supply is at its minimum. Therefore, the voltage across winding 130 due to any input or output variations will always be greater than or equal to the voltage across inductor 106. This also helps prevent load current from flowing through the snubber circuit path.

In addition, while capacitor 122 is illustrated as connected at the first and second diode 120 and 124 node to ground it could also be connected from that node to the output node $V_o$.

Figure 4:
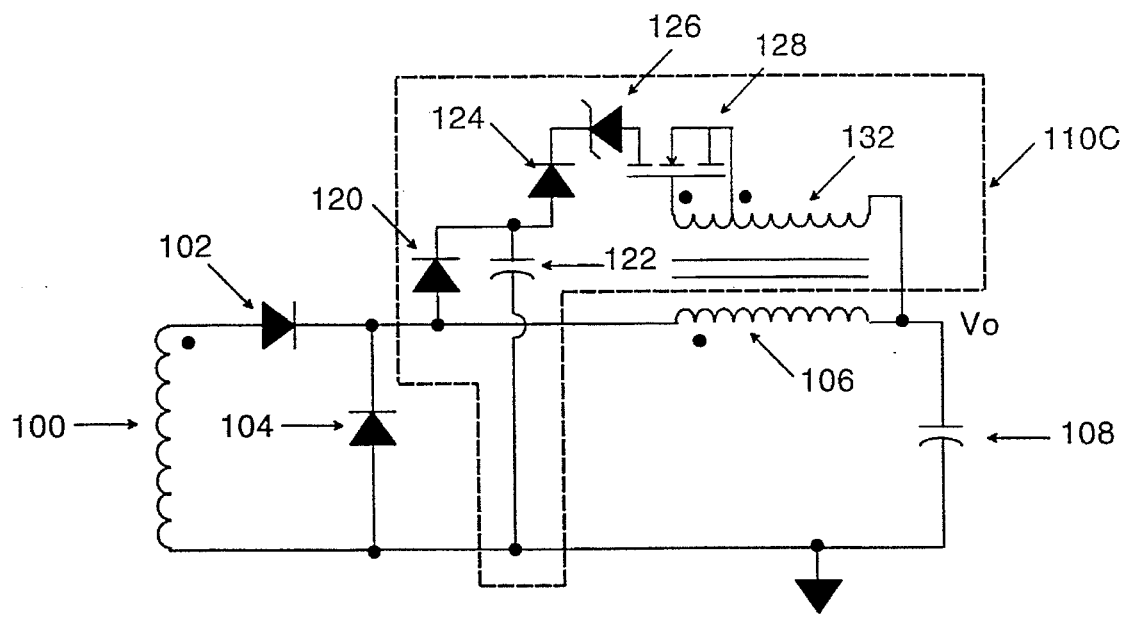
FIG. 4 is a schematic of the secondary portion of a switched mode power supply according to a second preferred embodiment of the present invention.

FIG. 4 is a schematic of the secondary portion of a switched mode power supply according to a second preferred embodiment of the present invention. The configuration of the elements of the secondary of FIG. 4 is very similar to the configuration of the elements of the secondary of FIG. 3, however, with one major exception. Second winding 132 is wound on inductor winding 106 instead of the secondary winding 100 as shown in FIG. 3. Winding 132 performs the same task as winding 130 in FIG. 3, however, the input and output voltage fluctuations are no longer a concern as the voltage across inductor 106 and winding 132 will track exactly because they are both wound on the same magnetic structure. The snubber circuit 110C operates in the same way as described with reference to FIG. 3 and thus need not be described in further detail.

Instead of diverting the parasitic voltage spike to the output of the power circuit, the parasitic voltage spike may alternatively be shunted to ground. Such an alternative construction of the power circuit is illustrated in the following two embodiments.

Figure 5:
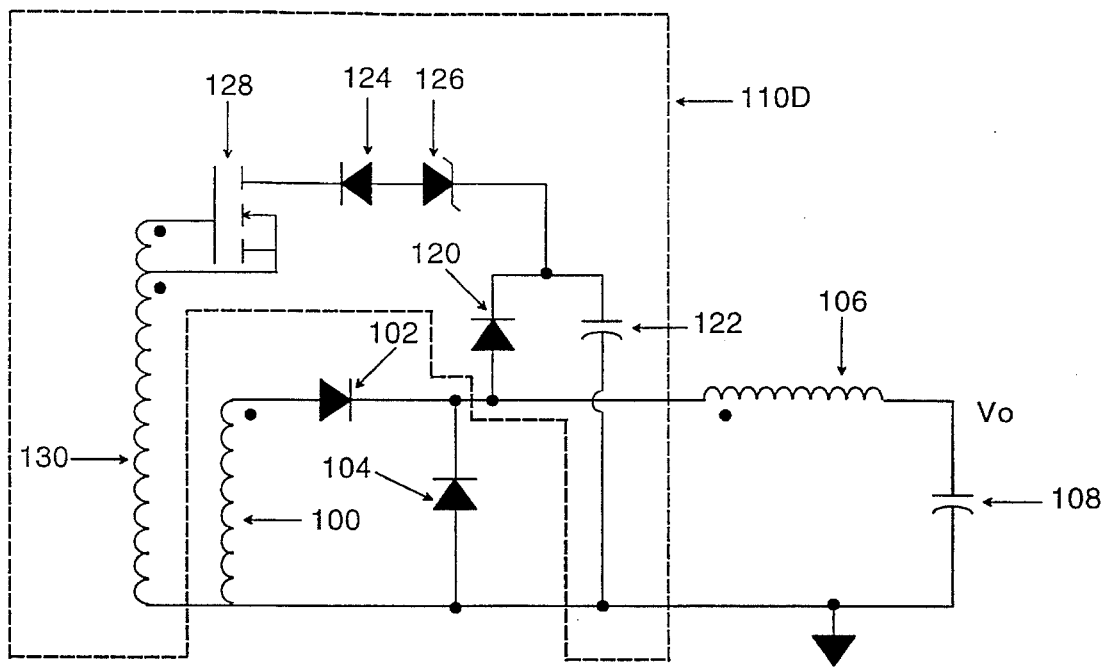
FIG. 5 is a schematic of the secondary portion of a switched mode power supply according to a third preferred embodiment of the present invention.

FIG. 5 is a schematic of the secondary portion of a switched mode power supply according to a third preferred embodiment of the present invention. The secondary portion has many of the same components arranged in the same configuration as the secondary portion described with reference to FIG. 2. Thus the same reference numerals used in FIG. 2 have been used to describe like components. In this preferred embodiment, the energy generated by the freewheeling diode 104 turning off is shunted to ground. The secondary winding 100, rectifying diode 102, freewheeling diodes 104, and the output inductor 106 and output capacitor 108 are all connected in the same way as already described with reference to FIG. 2 and thus need not be described again. The snubber circuit 110D according to this preferred embodiment, includes a first diode 120, a second diode 124, a third diode 126, a capacitor 122, a transistor 128 and a second winding 130. The winding 130 is preferably taken from the secondary winding 100 as was the case in FIG. 3, however, in this preferred embodiment, it is referenced to ground instead of the output node $V_o$. The components of the snubber circuit are connected as shown and thus need not be further described.

The operation of the snubber circuit 110D in the secondary portion of the power circuit will now be described. As previously discussed, when the secondary winding 100 receives an on pulse, freewheeling diode 104 becomes reversed biased and rectifying diode 102 and first diode 120 of the snubber circuit become forward biased. Again, the spike is attenuated by capacitor 122 when diode 120 is forward biased. During the on pulse the voltage across the second winding 130 from ground to the tap is equal to the voltage across secondary winding 100. The voltage from the tap of winding 130 to the gate of transistor 128 turns transistor 128 on allowing capacitor 122 to discharge through diode 124 and transistor 128 to a level approximately equal to the voltage from the secondary winding 100. When the pulse from the secondary 100 ends, the polarity across winding 130 reverses turning off the transistor 128 thereby preventing capacitor 122 from discharging. Thus, during the on pulse received from secondary winding 100, the parasitic voltage spike energy stored by capacitor 122 is shunted to ground instead of diverted to the output and used to power the load. In this preferred embodiment the power needed to turn off freewheeling diode 104 is lost. But the power that is generated by the snubber capacitor 112 charging and discharging which is governed by the equation ½ $CV^2f$, previously described, is not lost because the capacitor 122 does not discharge below the peak secondary voltage. Typically, the power generated by the snubber capacitor 122 charging and discharging is larger than the power generated by the turn-off of the freewheeling diode 104.

Figure 6:
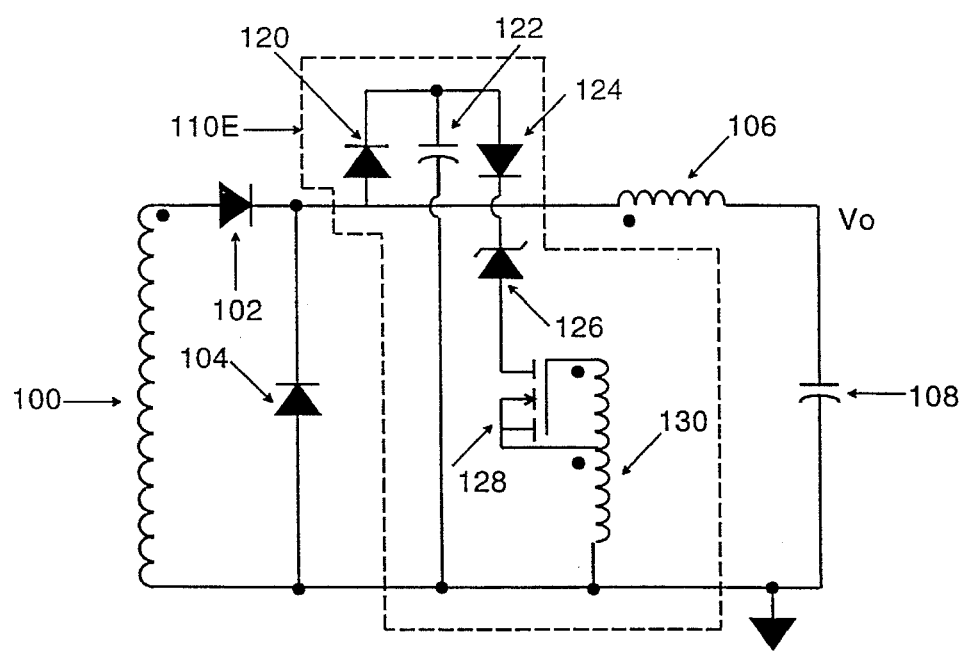
FIG. 6 is a schematic of the secondary portion of a switched mode power supply according to a fourth preferred embodiment of the present invention.

FIG. 6 is a schematic of the secondary portion of a switched mode power supply according to a fourth preferred embodiment of the present invention. As was true with reference to the previously described preferred embodiments, the secondary portion has many of the same components arranged in the same configuration as the secondary portion described with reference to FIG. 2. Thus the same reference numerals used in FIG. 2 have been used to describe like components. In this preferred embodiment, the energy developed by the freewheeling diode 104 turning off is again shunted to ground. The secondary winding 100, rectifying diode 102, freewheeling diodes 104, and the output inductor 106 and output capacitor 108 are all connected in the same way as already described with reference to FIG. 2 and thus need not be described again. The snubber circuit 110E according to this preferred embodiment, includes a first diode 120, a second diode 124, a third diode 126, a capacitor 122, a transistor 128 and a second winding 130. The second winding 130 is preferably wound on inductor winding 106. The components of the snubber circuit are connected as shown and thus need not be further described.

The operation of the snubber circuit 110E in the secondary portion of the power circuit will now be described. As previously discussed, when the secondary winding 100 receives an on pulse, freewheeling diode 104 becomes reversed biased and rectifying diode 102 and first diode 120 of the snubber circuit become forward biased. The voltage from the tap of the winding 130 to the gate of transistor 128 turns transistor 128 on when rectifying diode 102 is forward biased. The voltage spike generated by the freewheeling diode 104 is attenuated by capacitor 122 of the snubber circuit when diode 120 is forward biased. During this portion of the cycle, a flow path is created through first diode 120, second diode 124, third diode 126, transistor 128 and extra winding 130 so that the energy stored by capacitor 122 is allowed to discharge to ground through the snubber circuit down to a level approximately equal to the amplitude of the on pulse received by the secondary winding 100 but remain at a level high enough to prevent load current from flowing through this path. The third diode 126, preferably a zener diode, provides an added level of protection to prevent load current from being sent through the snubber circuit instead of flowing through output inductor 106. The third diode 126 in this embodiment and all other embodiments is used as an added measure of protection, but may be omitted if desired. The first and second diodes 120 and 124 prevent current from flowing from the load back through the snubber circuit to the input of the secondary winding 100.

When the on pulse from secondary winding 100 ends, the polarity across winding 130 reverses turning transistor 128 off which prevents capacitor 122 from discharging. Thus, all of the excess energy generated by the voltage spike is shunted to ground, however, as previously described with reference to FIG. 5, the power that is generated by the snubber capacitor 112 charging and discharging is not lost because the capacitor 112 never discharges below the peak secondary voltage.

Also, the voltage across winding 130 should match the voltage across secondary winding 100 when the input voltage to the supply is at its minimum and the output voltage of the supply is at its maximum. Therefore, the voltage across winding 130 due to any input or output variations will be greater than or equal to the voltage across secondary winding 100. This also helps prevent load current from flowing through the snubber circuit path.

Figure 7:
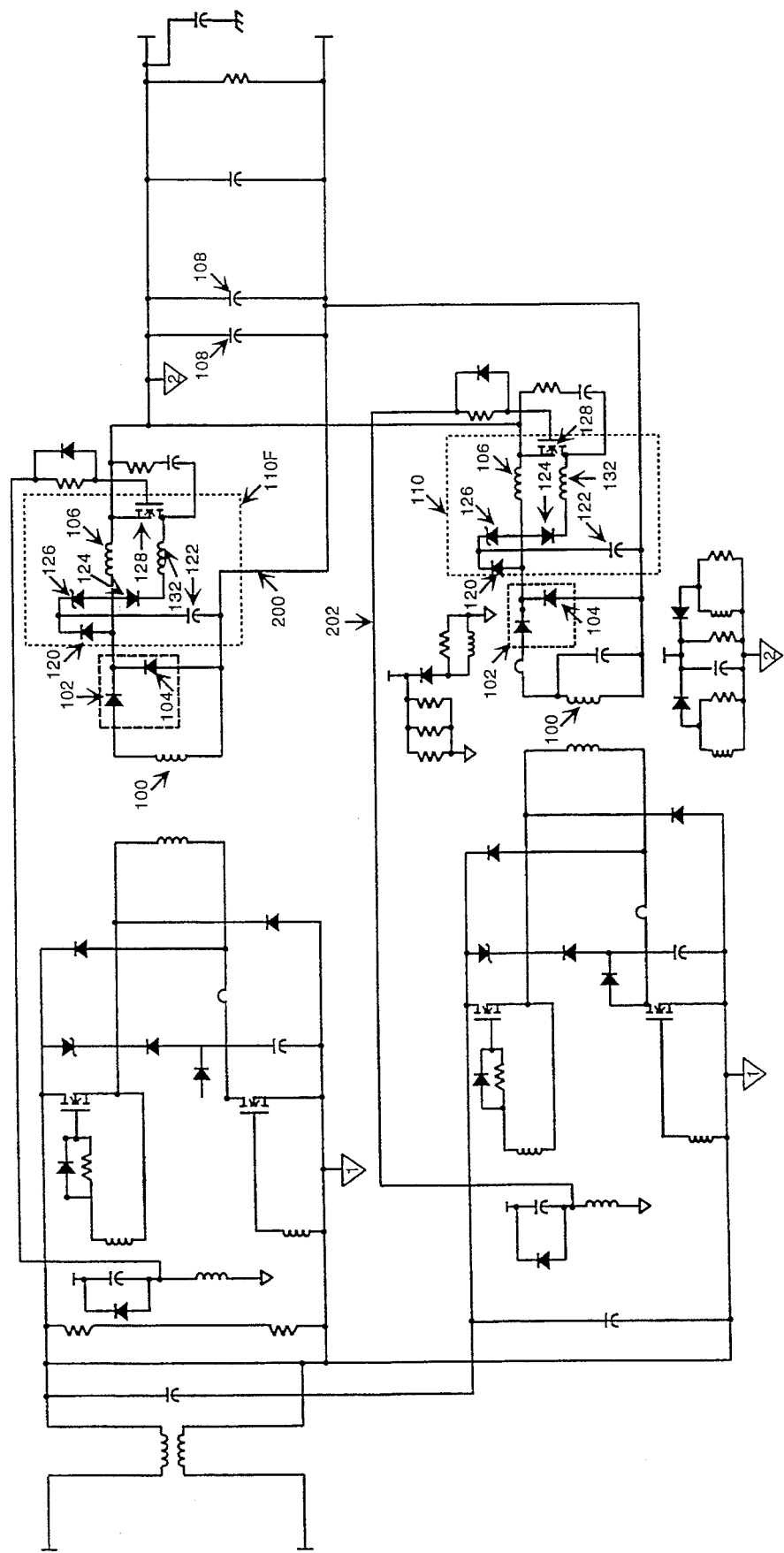
FIG. 7 is a schematic of a power circuit according to fifth preferred embodiment of the present invention.

FIG. 7 is a schematic of both the primary and secondary power circuit according to a fifth preferred embodiment of the present invention. The primary side is formed by a standard two transistor forward primary as is well known to those of ordinary skill in the art. The secondary side of the power circuit is divided into a first section 200 and a second section 202. The snubber circuits 110F of the first and second sections 200 and 202 are the same as that described with reference to FIG. 3. The first and second section 200 and 202 each individually have a secondary winding 100, a rectifying diode 102, a freewheeling diode 104, an output inductor 106, output capacitors 108 connected in parallel (which are shared by the first and second sections 200 and 202 of the secondary side of the power circuit) and a snubber circuit 110. In particular, the snubber circuit 110F shown in FIG. 7 includes the same components connected in the same configuration as shown in FIG. 4. Therefore, the snubber circuits 110F of FIG. 7 need not be described in greater detail.

In a preferred embodiment, the power circuit shown in FIG. 7 was constructed to provide 3000 watts rated at 60 volts and 50 amperes. The first and second sections 200 and 202 operate in parallel to provide 1500 watts each to the output. In a preferred embodiment, the following components have the following ratings:

rectifying diode 102 is a fast recovery diode rated at 400 volt, 60 ampere freewheeling diode 104 is a fast recovery diode rated at 400 volt, 60 ampere output inductor 106 is rated at 62 mHenry, 25 ampere output capacitors 108 are electrolytic capacitors rated at 5600 MF and 63 volts first and second diodes 120 and 124 are ultrafast recovery diodes rated at 1 ampere, 600 volts third diode 126 is a zener diode rated at 3.3 volts, 5 watts transistors 128 are a MOSFET transistor rated at 600 volts, 3 ampere snubber capacitor 122 is a metalized polypropylene capacitor rated at 0.1 MF, 400 volts.

Figure 8:
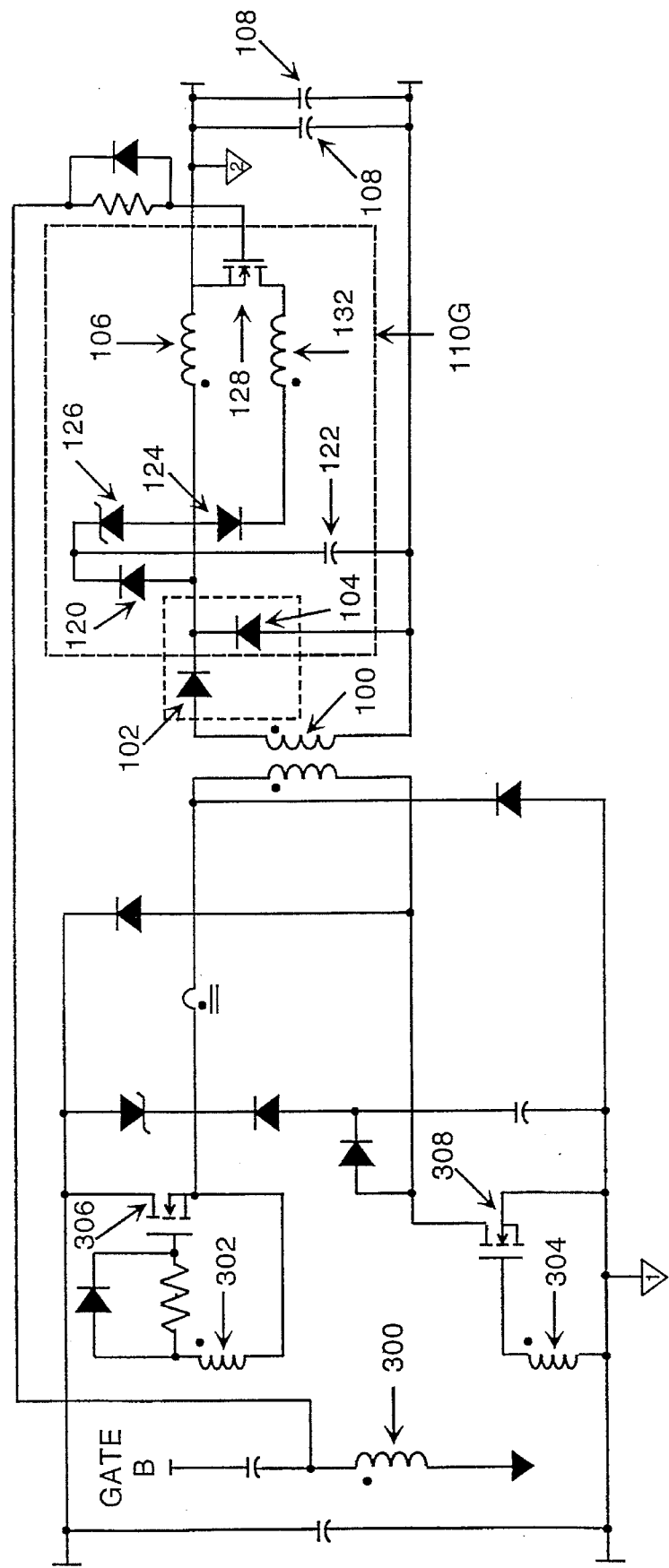
FIG. 8 is a schematic of a power circuit according to a sixth preferred embodiment of the present invention.

FIG. 8 is a schematic of both the primary and secondary power circuit according to a sixth preferred embodiment of the present invention. As previously discussed with reference to FIG. 7, the primary side is formed by a standard two transistor forward primary as is well known to those of ordinary skill in the art. The secondary side is similar to that shown in FIG. 7, however, transistor 128 is now controlled by the primary side of the power supply. More particularly, in a preferred embodiment the gate of transistor 128 is coupled to winding 300 on the primary side of the power circuit. Winding 300 along with windings 302 and 304 also control the drive transistors 306 and 308. Transistor 128 may be controlled in many other ways as long as it is turned on during the on pulse sent by the primary and turned off during the off pulse so that it connects the snubber capacitor to either the output or ground at the appropriate time. In addition, transistor 128 may be replaced by any other switching device as will be appreciated by those skilled in the art.

Of course other components having different ratings may be used and the present invention is not limited to the particular embodiments illustrated. While this invention has been shown and described in connection with the preferred embodiments, it is apparent that certain changes and modifications, in addition to those mentioned above, may be made from the basic features of the present invention. Accordingly, it is the intention of the Applicants to protect all variations and modifications within the true spirit and valid scope of the present invention.

What is claimed is:

1. A snubber circuit for snubbing a freewheeling diode in a secondary portion of a switched mode power circuit, the secondary portion including a secondary winding having a positive terminal and a grounded negative terminal, wherein the secondary winding receives a series of on and off pulses, a rectifying diode having its anode connected to the positive terminal of the secondary winding; the freewheeling diode having its anode grounded and its cathode connected to the cathode of the rectifying diode, an output inductor and output capacitor connected in series across the freewheeling diode wherein an input terminal of the inductor is coupled to the cathodes of the rectifying and freewheeling diodes and a terminal of the output capacitor grounded wherein the output is taken across the output capacitor, the snubber circuit comprising:

a snubber capacitor having a first terminal connected to ground and a second terminal;

a first diode having an anode coupled to the cathodes of the rectifying and freewheeling diodes, and a cathode coupled to the second terminal of the snubber capacitor, the first diode allowing the snubber capacitor during an on pulse to acquire sufficient charge from the secondary winding such that the voltage across the snubber capacitor is approximately equal to the voltage across the secondary winding;

a second diode having an anode coupled to the cathode of the first diode and the second terminal of the snubber capacitor;

a transistor having a drain, a gate and a source, the drain being coupled to the cathode of the second diode; and a second winding having a first terminal coupled to the output of the switched mode power circuit, a second terminal coupled to the gate of the transistor and a tap coupled to the source of the transistor.

2. A snubber circuit according to claim 1 wherein the second winding is disposed directly opposite of the output inductor.

3. A snubber circuit according to claim 1 wherein the second winding is wound on the output inductor.

4. A snubber circuit according to claim 1 wherein the second winding is wound on the secondary winding.

5. A snubber circuit according to claim 1 further comprising a third diode having its anode coupled to the anode of the second diode and its cathode coupled to the drain of the transistor.

6. A snubber circuit according to claim 5 wherein the third diode is a zener diode.

7. A snubber circuit for snubbing a freewheeling diode in a secondary portion of a switched mode power circuit, the secondary portion including a secondary winding having a positive terminal and a grounded negative terminal, wherein the secondary winding receives a series of on and off pulses, a rectifying diode having its anode connected to the positive terminal of the secondary winding; the freewheeling diode having its anode grounded and its cathode connected to the cathode of the rectifying diode, an output inductor and output capacitor connected in series across the freewheeling diode wherein an input terminal of the inductor coupled to the cathodes of the rectifying and freewheeling diodes and a terminal of the output capacitor is grounded wherein the output is taken across the output capacitor, the snubber circuit comprising:

a snubber capacitor having a first terminal connected to ground and a second terminal;

a first diode having an anode coupled to the cathodes of the rectifying and freewheeling diodes, and a cathode coupled to the second terminal of the snubber capacitor, the first diode allowing the snubber capacitor during an on pulse to acquire sufficient charge from the secondary winding such that the voltage across the snubber capacitor is approximately equal to the voltage across the secondary winding;

a second diode having an anode coupled to the cathode of the first diode and the second terminal of the snubber capacitor;

a transistor having a drain, a gate and a source, the drain being coupled to the cathode of the second diode; and a second winding having a first terminal grounded, a second terminal coupled to the gate of the transistor and a tap coupled to the source of the transistor.

8. A snubber circuit according to claim 7 further comprising a third diode having its anode coupled to the anode of the second diode and its cathode coupled to the drain of the transistor.

9. A snubber circuit according to claim 8 wherein the third diode is a zener diode.

10. A snubber circuit according to claim 7 wherein the second winding is wound on the output inductor.

11. A snubber circuit according to claim wherein the second winding is wound on the secondary winding.

12. A snubber circuit for snubbing the voltage spike generated by a freewheeling diode becoming reversed biased in the secondary of a switched mode power circuit, the secondary receiving a train of on and off pulses from a primary side of the circuit, the secondary having means for supplying current to an output, the snubber circuit comprising:

a snubber capacitor for storing the voltage spike generated by the freewheeling diode becoming reversed biased;

means for coupling the snubber capacitor to the freewheeling diode during an on pulse to allow the snubber capacitor to store the voltage spike generated by the freewheeling diode; and means for coupling the snubber capacitor to the output during an on pulse to allow the voltage spike stored by snubber capacitor to be directed to the output of the power circuit.

13. A method for snubbing a voltage spike generated by a freewheeling diode of a secondary of a switched mode power supply, the switched power supply receiving a train of on and off pulses from a primary side of the switch power supply, the method comprising the steps of:

coupling a snubber capacitor to the freewheeling diode during an on pulse to store the energy generated by the voltage spike of the freewheeling diode as it becomes reversed biased; and coupling the snubber capacitor to an output of the switched mode power supply during an on pulse to direct the energy stored in the snubber capacitor to ground during the on pulse.

* * * * *

UNITED STATES PATENT AND TRADEMARK OFFICE
CERTIFICATE OF CORRECTION

PATENT NO. : 5,615,094
DATED : March 25, 1997
INVENTOR(S) : Anthony P. Cosentino et al.

It is certified that error appears in the above-identified patent and that said Letters Patent is hereby corrected as shown below:

<u>On the Title Page</u> : Item [56]

In column 2, line 1, under "OTHER PUBLICATIONS", change "vol." to --Vol.--.

In column 2, line 2, under "OTHER PUBLICATIONS", change "gridge" to --bridge--.

Signed and Sealed this

Twenty-sixth Day of September, 2000

Attest:

Q. TODD DICKINSON

*Attesting Officer*    *Director of Patents and Trademarks*